United States Patent

Merchant et al.

[11] Patent Number: 4,551,709
[45] Date of Patent: Nov. 5, 1985

[54] INTEGRABLE DIGITAL/ANALOG CONVERTER

[75] Inventors: Kamal Merchant, Holzkirchen; Claude Schmitt, Ebersberg, both of Fed. Rep. of Germany

[73] Assignee: Siemens Aktiengesellschaft, Berlin and Munich, Fed. Rep. of Germany

[21] Appl. No.: 436,300

[22] Filed: Oct. 25, 1982

[30] Foreign Application Priority Data

Nov. 19, 1981 [DE] Fed. Rep. of Germany ....... 3145889

[51] Int. Cl.$^4$ ............................................. H03K 13/02
[52] U.S. Cl. ....................... 340/347 DA; 340/347 CC; 340/347 M
[58] Field of Search ..... 340/347 DA, 347 M, 347 CC

[56] References Cited

U.S. PATENT DOCUMENTS

| 4,267,550 | 5/1981 | Cecil | 340/347 DA |
| 4,381,499 | 4/1983 | Struthoff | 340/347 DA |

OTHER PUBLICATIONS

The Engineering Staff of Analog Devices, Inc., Analog-Digital Conversion Handbook, 6/1972, pp. II-36 to II-39.

Primary Examiner—T. J. Sloyan
Attorney, Agent, or Firm—Herbert L. Lerner; Laurence A. Greenberg

[57] ABSTRACT

Integrable digital/analog converter, comprising a reference d-c voltage or current source having two terminals, a conductor network having an input connected to the first terminal of the reference d-c source and having outputs, a plurality of double-throw switches each being in the form of a pair of transistors being controlled together by a digital signal to be evaluated, the double-throw switches each having a first current-carrying terminal connected to the second terminal of the reference d-c source through ground, a second current-carrying terminal carrying current in both of the switching positions each being connected to one of the outputs of the conductor network, and a third current-carrying terminal, a common operational amplifier forming an output of the converter and having an inverting input connected to each of the third terminals, a resistor being connected to the operational amplifier in a negative feedback loop, and a device for weighting the double-throw switches to individually set the internal resistance $\theta_i$ thereof according to the relationship:

$$\theta_i = r/2^i,$$

where:
i is the number of the respective double-throw switch which decreases with decreasing current load of the double-throw switches through the conductor network, and the double-throw switch carrying the smallest current is given the number 0, the resistor in the negative feedback loop of the operational amplifier having a resistance value being equal to the sum of one-half the internal resistance of the double-throw switch carrying the largest current and the base resistance of the conductor network.

9 Claims, 5 Drawing Figures

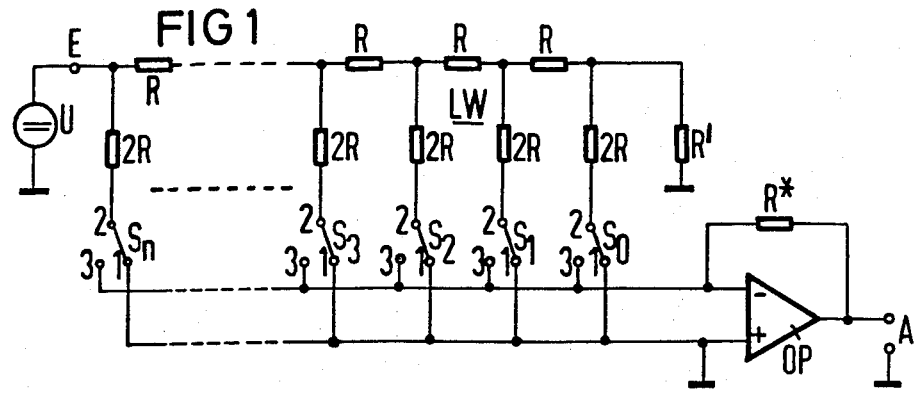
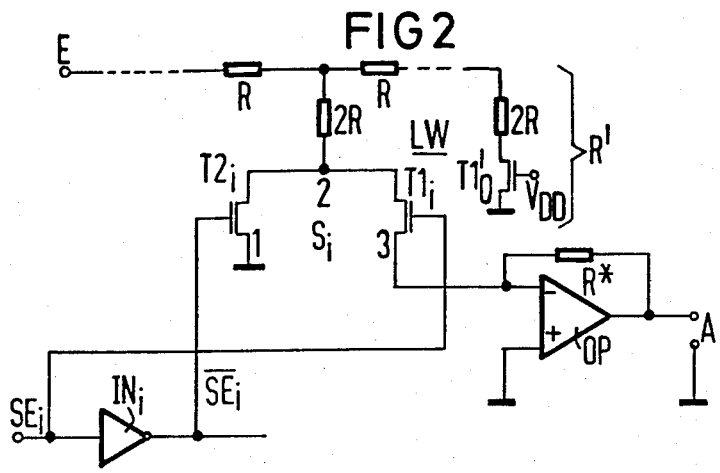
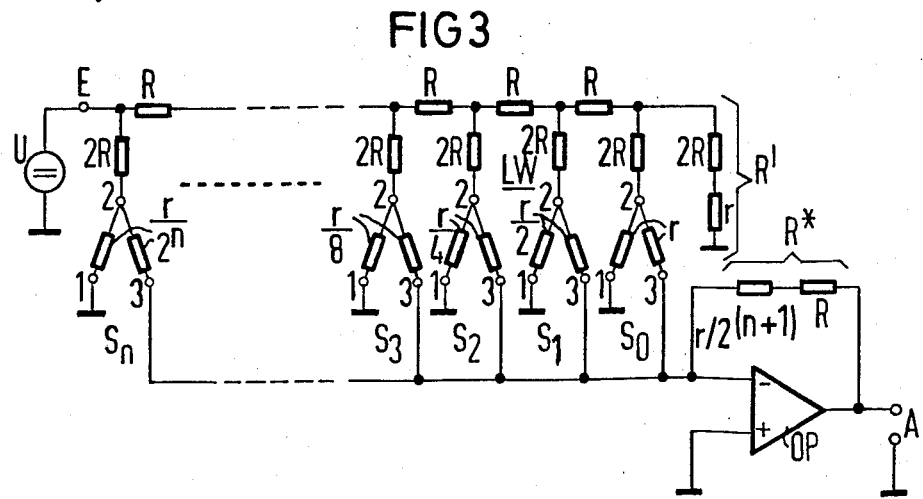

4,551,709

INTEGRABLE DIGITAL/ANALOG CONVERTER

The invention relates to an integrable digital/analog converter in which one terminal of a reference d-c voltage source or a reference d-c current source is connected to the input of a conductor network and the other terminal of the d-c voltage or d-c current source is connected to a first current-carrying terminal of three terminals of a number of double-throw switches which are each provided in the form of a pair of transistors, and are controlled together by a digital signal to be evaluated, the second current-carrying terminal being retained as the current-carrying terminal in both positions of the double-throw switches and each being connected to one output of the conductor network, and the third current-carrying terminal of all of the double-throw switches being connected to the inverting input of a common operational amplifier which is provided with negative feedback through a resistor and forms the output of the converter.

According to experience, the manufacture of such D/A converters with weighted double-throw switches requires costly trimming of the resistor in the negative feedback loop of the operational amplifier.

It is accordingly an object of the invention to provide an integrable digital/analog converter which overcomes the hereinafore-mentioned disadvantages of the heretofore-known devices of this general type, and to use binary weighted double-throw switches which permit the considerable reduction of such expenses.

With the foregoing and other objects in view there is provided, in accordance with the invention, an integrable digital/analog converter, comprising a reference d-c voltage or current source having first and second terminals, a conductor network having at least one given base or fundamental resistance, having an input connected to the first terminal of the reference d-c source and having outputs, a plurality of double-throw switches having two switching positions including a switch carrying the smallest current and a switch carrying the largest current, each of the switches being in the form of a pair of transistors being controlled together by a digital signal to be evaluated, the double-throw switches each having a first current-carrying terminal connected to the second terminal of the reference d-c source through ground, a second current-carrying terminal carrying current in both of the switching positions each being connected to one of the outputs of the conductor network, and a third current-carrying terminal, a common operational amplifier forming an output of the converter and having an inverting input connected to each of the third current-carrying terminals, a resistor being connected to the operational amplifier in a negative feedback loop, and means for weighting the double-throw switches in a manner known per se to individually set the internal resistance $\theta_i$ thereof according to the relationship:

$$\theta_i = r/2^i,$$

where:
i is the number of the respective double-throw switch which decreases with decreasing current load of the double-throw switches through the conductor network, and the double-throw switch carrying the smallest current is given the number 0, the resistor in the negative feedback loop of the operational amplifier having a resistance value being equal to the sum of one-half the internal resistance of the double-throw switch carrying the largest current and the base or fundamental resistance of the conductor network.

In accordance with another feature of the invention, the resistor in the negative feedback loop is in the form of a series circuit of a first part corresponding to the base resistance or resistances of the conductor network, and a second part being a parallel circuit of two transistors being the same as the transistors of the double-throw switch obtaining the largest current from the conductor network.

In accordance with a further feature of the invention, the means for weighting the double-throw switches is a parallel and/or series connection of a number $2^{i-m}$ of identical elementary transistors, where m is a number 0, 1 ... n, and especially n/2 or (n±1)/2.

In accordance with an added feature of the invention, there are inverters, each being connected to a respective first current-carrying terminal of the double-throw switches for controlling the operating state thereof, and the operating state of the third current-carrying terminals being controlled directly by the signal input of the respective double-throw switch addressed by the digital signal to be addressed.

In accordance with an additional feature of the invention, the conductor network is in the form of a network of resistors of a given value and resistors of twice the given value i.e. an R-2R network, the conductor network including a terminating resistor connected to ground, the terminating resistor being in the form of a series circuit of a resistor having twice the resistance of the base resistor of the conductor network, and another resistor connected in the flow direction having the value of the internal resistance of the double-throw switch carrying the lowest current.

In accordance with again another feature of the invention, the operational amplifier includes transistors and all of the transistors of the converter including the transistors in the operational amplifier are MOS field-effect transistors.

In accordance with a concomitant feature of the invention, the operational amplifier and the inverters are formed of transistors, and all of the transistors of the converter including the transistors in the operational amplifier and the inverters are MOS field-effect transistors.

Other features which are considered as characteristic for the invention are set forth in the appended claims. Although the invention is illustrated and described herein as embodied in an integrable digital/analog converter, it is nevertheless not intended to be limited to the details shown, since various modifications and structural changes may be made therein without departing from the spirit of the invention and within the scope and range of equivalents of the claims.

The construction and method of n of the invention, however, together with additional objects and advantages thereof will be best understood from the following description of specific embodiments when read in connection with the accompanying drawings, in which:

FIGS. 1 and 2 are schematic circuit diagrams of customary digital/analog converters:

FIG. 3 is a schematic circuit diagram showing the weighted adjustment of internal resistances of double-throw switches:

Figure 4:
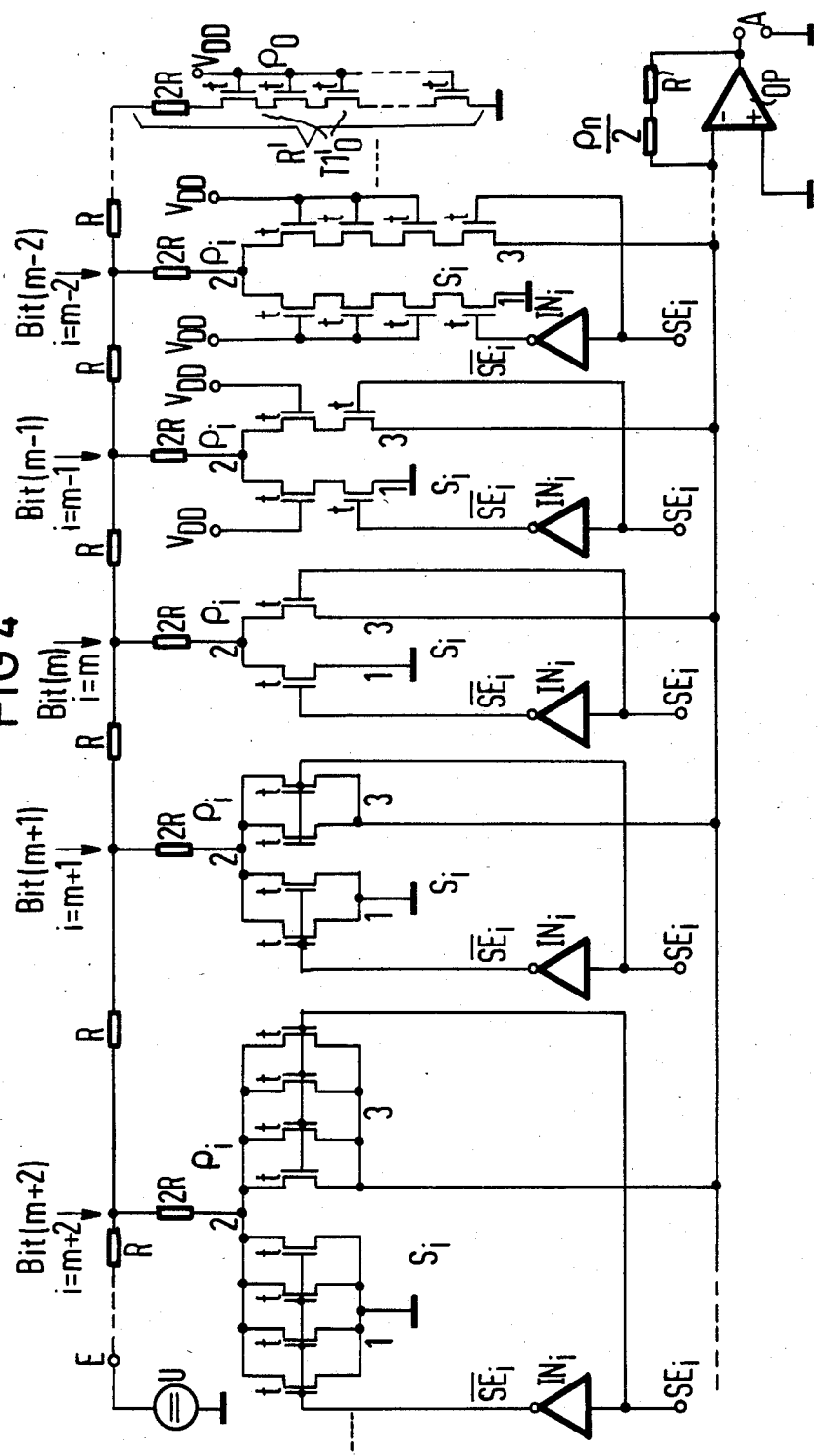
FIG. 4 is a schematic circuit diagram of an embodiment of weighted switches and a terminating resistance according to the invention.

Referring now to the figures of the drawing and first particularly to FIGS. 1 and 2 thereof, it is seen that during the operation of such circuits, in accordance with the digital significance of the input signal to be converted, weighted currents are produced by the conductor network at the outputs thereof and these currents are each connected through one of the aforementioned double-throw switches to the operational amplifier forming the output of the converter. A drive of the operational amplifier corresponding to the digital signal applied, and accordingly a drive of the signal output of the digital/analog converter is therefore caused.

To this end, in an (n+1)-bit D/A converter of the type described above, one terminal of a reference d-c voltage source U (or a reference d-c current source) is connected to ground in a manner seen from FIG. 1. The other terminal of the source U is connected to an input E of a conductor network LW constructed as an R-2R network. The conductor network LW is formed in the manner shown in FIG. 1, of n equal series-connected resistors R which together form a voltage divider. One end of the voltage divider at reference symbol E forms the input of the conductor network LW and the voltage divider is connected at the other end thereof to ground through a terminating resistor R'. The terminating resistor R' normally has the resistance value 2 R. In the case of the present invention, however, the terminating resistor R' is constructed in such a way that it is formed of a series circuit of twice the base resistor, i.e., a resistance 2R, and a switching resistor $\theta_o$, the description of which will be given below.

Obviously, the terminating resistor R' forms a link of the voltage divider formed by the n base resistors R, and therefore defines a further divider point of the voltage divider formed by (n+1) series-connected resistors. Each divider point between two adjacent resistors of the above-mentioned divider chain as well as the input E of the voltage divider, is connected through a shunt resistor 2R, i.e., a resistor having twice the resistance value of the base resistor R, to an output 2 of the conductor network LW. Each of the outputs 2 is identical with the second terminal, according to the definition given above, of one of the double-throw switches which are provided. The conductor network LW obviously has a total of (n+1) such outputs 2.

As indicated above, each of these outputs 2 represents the particular current-carrying terminal of one of the (n+1) double-throw switches $S_o$, $S_1$, $S_2$, ... $S_n$ provided, which carries current in both operating positions of the double-throw switch $S_i$ (i=0, 1, 2, ... n). Meanwhile the other two terminals 1 and 3 of the individual double-throw switches $S_i$ conduct, and therefore alternatively carry current in only one or the other operating phase of the double-throw switch, as may be seen directly from the illustration according to FIG. 1.

In FIG. 1, all of the resistors having a resistance which corresponds to the base value R, are designated in the conductor network LW with reference symbol "R", and the resistors having the resistance value which is twice as large, are designated with reference symbol "2R". The double-throw switches $S_i$ are shown as mechanical switches. In the production of the circuit of such a D/A converter, however, switching transistors, especially field-effect transistors which have an insulated gate and are of the self-blocking type, are used.

Depending on the position of the switch $S_i$, the respective terminal 2 connected to the associated ($i^{th}$) output of the conductor network LW of each individual double-throw switch $S_i$ connects the respective output of the conductor network LW through the terminal 1 to ground, or it connects the output of the network LW through the terminal 3 of the switch $S_i$ to the inverting input "−" of the afore-mentioned common operational amplifier OP. The output A of the operational amplifier OP forms the signal output of the D/A converter, which is connected through a negative feedback resistor R* to the input "−" driven in common through the double-throw switch $S_i$. The non-inverting input "+" of the operational amplifier OP, on the other hand, is connected to ground.

The digitally controlled double-throw switches $S_i$ are advantageously constructed in the manner shown in FIG. 2, inasmuch as they are in the form of two identical MOS field-effect transistors $T1_i$ and $T2_i$ (i=0, 1 ... n), especially of the self-blocking type. A signal input $SE_i$ which can be addressed by the digital input signal is connected directly to the gate of the transistor $T1_i$, which connects the respective output 2 of the conductor network LW through its source-drain path to the input "−" of the operational amplifier OP. The gate of the other transistor $T2_i$ connecting the output 2 of the conductor network LW to ground, is controlled by the inverted signal input $\overline{SE}_i$ which is generated from the direct signal input $SE_i$, using an inverter $IN_i$. The circuit according to FIG. 2 applies, in principle, to each of the (n+1) double-throw switches $S_i$ which are provided.

As is well known, the embodiment shown in FIG. 2 for the individual double-throw switches $S_o$, $S_1$ ... $S_n$, which is highly recommended for known reasons, can be improved further by binary weighting of the internal resistance $\theta_o$, $\theta_1$, $\theta_2$, ... $\theta_n$ of the double-throw switches $S_o$, $S_1$, $S_2$ ... $S_n$, taking care that the internal resistance $\theta_i$ of the switch $S_i$ is the same in the two positions of the switch. This means that the two transistors $T1_i$ and $T2_i$ are identical as before but that, on the other hand, a weighting of the internal resistance $\theta_i$ of the double-throw switches $S_i$ provided from stage to stage, is obtained by appropriate staggering of the W/L ratios of these transistors from switch to switch (for instance, by parallel or series connection of base transistors t with identical properties).

It is accordingly advisable to construct the terminating resistor R' in the conductor network LW in such a manner that the terminating resistor R' as already mentioned, is formed by a series connection of a resistor 2R having twice the base resistance of the resistor R with the base value $\theta_o$ for the internal resistances $\theta_i$ of the switches $S_i$, where the base value $\theta_o$ corresponds to the internal resistance of the switch $S_o$ (i.e., the switch for the LSB - least significant bit). It is further advisable to provide the resistance $\theta_o$ forming the terminating resistor R' together with the resistor 2R, in the same manner as the transistor $T1_o$ (=$T2_o$) of the switch $S_o$. For this reason, the transistor $T1_o'$ is shown in FIG. 2 as a transistor which connects the resistor 2R at the end of the voltage divider in the conductor network LW to ground through its source-drain path. Furthermore, the transistor $T1_o'$ corresponds, with respect to its electrical and other properties, to the switching transistor $T1_o$ and the switching transistor $T2_o$, respectively, of the switch $S_o$. Additionally, the gate of the transistor $T1_o'$ is connected to the other supply potential $V_{DD}$ of the circuit (a different reference potential tied to ground), so that the internal resistance of the transistor $T1_o'$ larggely agrees with the internal resistance of the transistor $T1_o$ in the double-throw switch $S_o$. The transistor $T1_o'$ is always in the conducting state because of the drive shown.

The double-throw switch $S_o$ farthest removed from the input E of the conductor network LW acted upon by the reference voltage source (or reference current source) U is assigned to the LSB of the digital input signal as already mentioned and due to the already mentioned weighting, it is given the highest internal resistance $\theta_o = r$, to be called the base value r. If the number i of the individual double-throw switches $S_i$ becomes higher as the connection 2 of the particular double-throw switch $S_i$ becomes closer to the input E of the conductor network LW addressed by the reference voltage (or reference current), then the internal resistance $\theta_i$ to be set for this switch Sis obtained according to the relationship:

$$\theta_i = r/2^i = \theta_o/2^i \ (i = o, 1, 2, \ldots n).$$

The transistors $T1_i$ and $T2_i$ for the individual switches $S_i$ may be provided in the form of transistors t with equal binary weighting, which may be connected either in parallel or in series; the individual transistors t form the entire circuit being constructed in the same manner (for instance, with respect to geometry and doping). This method is used for providing the double-throw switches $S_i$ shown in FIG. 4. In FIG. 3, the weighted adjustment of the internal resistances $\theta_i$ of the individual double-throw switches is likewise indicated.

Fabricating such digital/analog converters with weighted double-throw switches $S_i$ requires costly trimming of the resistor $R^*$ in the negative feedback loop of the operational amplifier OP, according to experience. It is therefore the objective of the present invention to describe a possibility, using binary weighted double-throw switches $S_i$, the use of which allows this expense to be reduced considerably.

In order to achieve this objective, a weighting of the double-throw switches $S_i$ ($i = 0, 1, \ldots n$) is performed, according to the invention, in an integrable digital-/analog converter corresponding to the hereinaforementioned type, in a manner known per se, in such a way that the internal resistance $\theta_i$ of the individual double-throw switches $S_i$ is set according to the relationship:

$$\theta_i = r/2^i \ (i = 0, 1, 2, \ldots n),$$

where the number i of the respective double-throw switch $S_i$ decreases with decreasing current load of the double-throw switches $S_i$ through the conductor network LW and the double-throw switch $S_o$ carrying the smallest current is given the number "0". Furthermore, the resistor $R^*$ in the negative feedback loop of the operational amplifier OP is constructed in such a way that its resistance value is equal to the sum of one-half the internal resistance $\theta_n = r/2^n$ of the double-throw switch $S_n$ carrying the largest current and the base resistance R of the conductor network LW.

According to the invention, the following relationship $$R^* = R + r/2^{(n+1)}$$

therefore applies for the negative feedback resistance $R^*$ connected to the operational amplifier OP. This therefore means, as may be seen from FIG. 3, that in addition to the conventional weighting of the internal resistances $\theta_i$ of the double-throw switches $S_i$, a negative feedback loop with a resistance $R^*$ which is matched to this weighting, as well as to the base resistance R of the conductor network LW, is applied in a D/A converter according to the invention.

The construction of the negative feedback resistance $R^*$ of the operational amplifier OP is based on the fact that the total resistance of the D/A converter has the value $R + r/2^{(n+1)} = R + \theta_n/2$, which is obtained due to the structure of the converter from the R-2R conductor network LW with the resistors R and 2R, as well as from the binary weighted double-throw switch resistances $\theta_i$. The feedback resistance $R^*$, however, is to correspond exactly to this total resistance.

Since, as already mentioned, the weighting of the double-throw switches $S_i$ can be provided according to their numbering i in a simple manner, especially in an integrated circuit, a high accuracy of the D/A conversion is achieved. The construction of the negative feedback with the two resistance components R and $\theta_n/2$ makes the circuit independent of the ratio of the binary switch resistances $\theta_i$ to the resistances R and 2R, respectively, in the conductor network. The circuit is therefore independent of variations of this ratio due to process variations and temperature conditions in the D/A converter according to the invention, which is not the case in the conventional D/A converters. In addition, the otherwise necessary, costly trimming of the negative feedback resistance $R^*$ for the operational amplifier OP is eliminated in the construction of a D/A converter according to the invention, because the resistance value $\theta_n/2$ in the negative feedback resistance $R^*$ is included in the integration.

Figure 5:
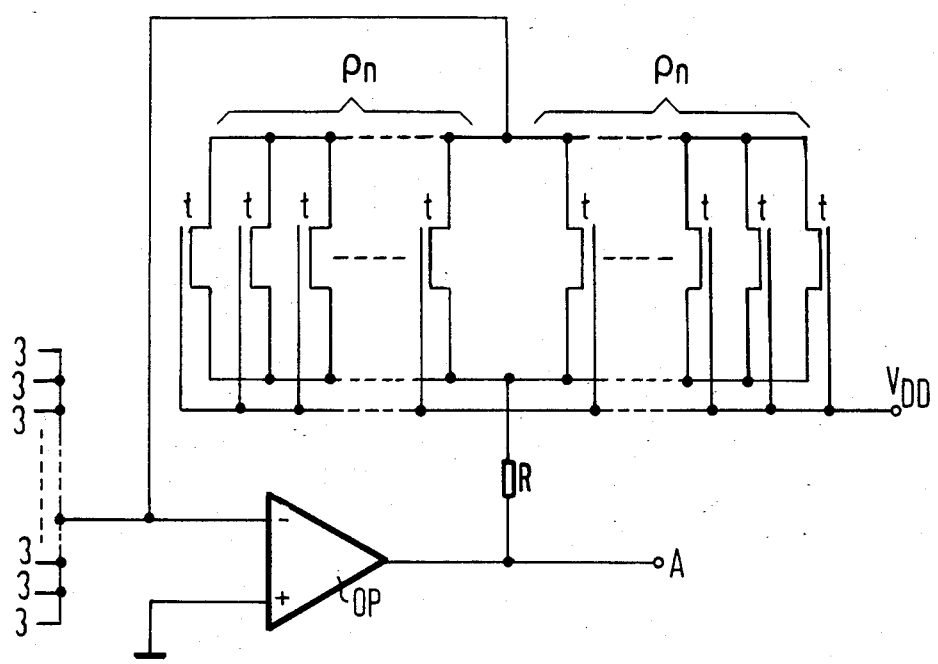
FIG. 5 is a schematic circuit diagram of the negative feedback of the operational amplifier according to the invention.

In FIG. 4, a practical embodiment of the weighted switches as well as the terminating resistance R' of the conductor network LW according to the invention is shown. FIG. 5 shows the pertinent negative feedback of the operational amplifier corresponding to the invention.

Starting out from the middle stage, or one of the two middle stages, of the D/A converter, the two switching transistors $T1_m$ and $T2_m$ are each provided in the form of an MOS field-effect transistor t, which, as already mentioned above, is used as the elementary transistor with defined properties, especially with a defined path resistance $\theta_m$, as well as for providing the switching transistor $T1_i$ and $T2_i$ of the remaining double-throw switches $S_i$ by parallel and series connection. The middle stage of the D/A converter shown in FIG. 4 (if (n+1) is an uneven number, there is a middle stage; if (n+1) is even, there are two middle stages) has the subscript "m", so that the corresponding double-throw switch is $S_m$. The double-throw switch $S_m$, which has the same value of the internal resistance $\theta_m$ in its two positions, is to be provided by the two transistors $T1_m$ and $T2_m$. All double-throw switches $S_{m+1}, S_{m+2}, \ldots S_n$, which, due to the binary weighting, have a lower internal resistance as compared to the double-throw switch $S_m$, are each formed of two composite transistors $T1_i, T2_i$ ($i = m+1, m+2, \ldots n$) which in turn are provided by a number of mutually parallel-connected elementary transistors t (with the internal resistance $\theta_m$) required for providing the weighted lower internal resistance $\theta_i$. On the other hand, all of the double-throw switches $S_{m-1}, S_{m-2} \ldots S_o$ having an internal resistance $\theta_i$ which is higher than the double-throw switch $S_m$, having the transistors $T1_m = T2_m = t$, are formed by (identical) switching transistors $T1_i$, $T2_i$, which are respectively formed of a number of series-connected elementary transistors t $(=T1_m=T2_m)$ required for obtaining the weighted internal resistance $\theta_i$ of the respective double-throw switch $S_i$.

Accordingly, the respective identical switching transistors $T1_i$ and $T2_i$ of the individual double-throw switches $S_i$ are formed in an embodiment according to FIG. 4, of $2^{i-m}$ identical elementary transistors which, in the case of $i > m$, are connected parallel to each other and are connected in such a way that their gates are connected jointly to the corresponding signal input $SE_i$ or $\overline{SE}_i$. Meanwhile, in the case of $i < m$, the number of elementary transistors t required for realizing the respective transistor $T1_i$ or $T2_i$ are connected in series with regard to their source-drain paths. For the case of $i=m$, there is obviously only one elementary transistor t for the transistor $T1_m$ and one elementary transistor t for the transistor $T2_m$.

In the interest of providing a fast response of the switching transistors $T1_i$ and $T2_i$, which are formed by a series circuit of elementary transistors t (i.e., in the case of the double-throw switches $S_{m-1}, S_{m-2} \ldots S_o$), only the gate of the elementary transistor connected to the respective operational amplifier OP or to ground is addressed by the corresponding signal input $SE_i$ or $\overline{SE}_i$, respectively. The gates of all of the other elementary transistors t of these series circuits are connected jointly to the supply potential $V_{DD}$ and are accordingly permanently conducting in operation. However, the application of the supply potential $V_{DD}$ is not absolutely necessary for this purpose. The double-throw switch $S_o$ belonging to the LSB stage $i=0$ obviously has the most elementary transistors t connected in series for its transistors $T1_o$ and $T2_o$. A further transistor $T1_o'$, identical with these two transistors, is also provided in the terminating resistance R' of the conductor network LW, as shown in FIG. 4. Contrary to the transistors $T1_o$ and $T2_o$ of the double-throw switch $S_o$, however, all elementary transistors t are in the conducting state.

The R-2R conductor network LW can be advantageously constructed of resistance films of polycrystalline silicon of suitable shape and suitably adjusted electric conductivity, where these resistance films are applied to an $SiO_2$ layer which is supported by the monocrystalline silicon chip containing the other parts of the A/D converter.

It is furthermore essential for the invention, as shown in FIG. 5, for the negative feedback resistance R* to be provided in the form of a series circuit of a resistor of the same resistance as the base resistance R in the conductor network LW, and a resistor of the resistance value $\theta_n/2 = r/2^{(n+1)}$. For this reason, a parallel circuit of the elementary transistors t with a resistor R corresponding to the provision of the resistance R in the conductor network LW, constructed of two composite transistors, corresponding to the transistors $T1_n$ and $T2_n$, respectively, of the double-throw switch $S_n$ in the $n^{th}$ stage associated with the MSB (most significant bit) of the D/A converter is connected in series with a resistor R corresponding to the construction of the resistances R in the conductor network LW for the purpose of connecting the inverted input "−" of the operational tional amplifier OP to the output A of this operational amplifier. This series circuit is furthermore connected on one hand to the input "−", and on the other hand to the output A of the operational amplifier OP. The parallel-connected elementary transistors t are permanently in the conducting state during operation because of the potential $V_{DD}$. It is advisable for the parallel-connected elementary transistors t of this composite circuit forming the negative feedback resistance R* to be connected with their current-carrying paths directly to the input "−". The resistance R* in the negative feedback loop thus contains a total of $2^{(|n-m|+1)}$ elementary transistors t.

The operational amplifier OP can be constructed, for instance, in the manner seen from the article "IEEE Journal of Solid-State Circuits" SC-16 (August 1981), pages 318 or 330, in CMOS technology. Advantageously, the operational amplifier OP will be monolithically combined with the double-throw switches $S_i$ and the inverters $IN_i$ as well as the conductor network LW in one chip, and the technique to be applied for its construction will be adapted to the technique to be used for constructing the inverters (single-channel MOS technique or CMOS technique). The construction of the transistors t and $T1_i$, $T2_i$, respectively, in n-channel technology is more advantageous than a construction in p-channel technology because of the higher switching speed. However, the circuit can also be provided in bipolar technology, in which case the transistors are replaced by corresponding bipolar transistors. In practice, the hereinafore-described construction in MOS technology has proven itself particularly valuable.

The foregoing is a description corresponding to German Application No. P 31 45 889.0, dated Nov. 19, 1981, the International priority of which is being claimed for the instant application and which is hereby made part of this application. Any discrepancies between the foregoing specification and the aforementioned corresponding German application are to be resolved in favor of the latter.

We claim:

1. Integrable digital/analog converter, comprising a reference d-c voltage or current source having first and second terminals, an R/2R ladder network having a given base resistance R, having an input connected to said first terminal of said reference d-c source and having outputs, a plurality of double-throw switches having two switching positions including a switch carrying the smallest current and a switch carrying the largest current, each of said switches being in the form of a pair of transistors being controlled together by a digital signal to be evaluated, said double-throw switches each having a first current-carrying terminal connected to said second terminal of said reference d-c source through ground, a second current-carrying terminal carrying current in both of said switching positions each being connected to one of said outputs of said R/2R ladder network, and a third current-carrying terminal, a commom operational amplifier forming an output of the converter and and having an inverting input connected to each of said third current-carrying terminals, a resistor being connected to said operational amplifier in a negative feedback loop, and means for weighting said double-throw switches to individually set the internal resistance $\theta_i$ thereof according to the relationship:

$$\theta_i = r/2^i,$$

where:

i is the number of said respective double-throw switch which decreases with decreasing current load of said double-throw switches through said R/2R ladder network, and said double-throw switch carrying the smallest current is given the number 0, said resistor in said negative feedback loop of said operational amplifier having a resistance value being equal to the sum of one-half the internal resistance of said double-throw switch carrying the largest current and said base resistance of said R/2R ladder network.

2. Converter according to claim 1, wherein said resistor in said negative feedback loop is in the form of a series circuit of a first part corresponding to said base resistance of said R/2R ladder network, and a second part being a parallel circuit of two transistors being the same as said transistors of said double-throw switch obtaining the largest current from said R/2R ladder network.

3. Converter according to claim 2, wherein said means for weighting said double-throw switches is a connection of a number $2^{i-m}$ of identical elementary transistors, where m is a number 0, 1 ... n.

4. Converter according to claim 3, wherein said number m is n/2.

5. Converter according to claim 3, wherein said number m is $(n\pm 1)/2$.

6. Converter according to claim 3, including a plurality of inverters, each being connected to a respective first current-carrying terminal of said double-throw switches for controlling the operating state thereof, and the operating state of said third current-carrying terminals being controlled directly by the signal input of said respective double-throw switch addressed by the digital signal to be addressed.

7. Converter according to claim 1, wherein said R/2R ladder network is in the form of a network of resistors of a given value and resistors of twice said given value, said R/2R ladder network including a terminating resistor connected to ground, said terminating resistor being in the form of a series circuit of a resistor having twice the resistance of said base resistor of said R/2R ladder network, and another resistor connected in the flow direction having the value of the internal resistance of said double-throw switch carrying the lowest current.

8. Converter according to claim 1, wherein said operational amplifier includes transistors and all of said transistors of the converter including said transistors in said operational amplifier are MOS field-effect transistors.

9. Converter according to claim 6, wherein said operational amplifier and said inverters are formed of transistors, and all of said transistors of the converter including said transistors in said operational amplifier and said inverters are MOS field-effect transistors.

* * * * *